United States Patent [19]

Martin et al.

[11] Patent Number: 5,923,899
[45] Date of Patent: Jul. 13, 1999

[54] SYSTEM FOR GENERATING CONFIGURATION OUTPUT SIGNAL RESPONSIVE TO CONFIGURATION INPUT SIGNAL, ENABLING CONFIGURATION, AND PROVIDING STATUS SIGNAL IDENTIFYING ENABLED CONFIGURATION RESPONSIVE TO THE OUTPUT SIGNAL

[75] Inventors: Chris G. Martin; Manny K. F. Ma, both of Boise, Id.

[73] Assignee: Micron Technology, Inc., Boise, Id.

[21] Appl. No.: 08/696,246

[22] Filed: Aug. 13, 1996

[51] Int. Cl.$^6$ ............................. G06F 9/06; G06F 12/14
[52] U.S. Cl. ......................... 395/828; 395/651; 326/38; 327/108
[58] Field of Search ................... 395/821, 828, 395/651; 326/38; 327/108

[56] References Cited

U.S. PATENT DOCUMENTS

| | | | |
|---|---|---|---|
| 5,600,271 | 2/1997 | Erickson et al. | 327/108 |
| 5,608,342 | 3/1997 | Trimberger | 326/38 |
| 5,652,844 | 7/1997 | Harwood, III | 395/284 |
| 5,715,207 | 2/1998 | Cowell | 365/230.02 |
| 5,727,207 | 3/1998 | Gates et al. | 395/651 |

*Primary Examiner*—Thomas C. Lee
*Assistant Examiner*—Rehana Perveen
*Attorney, Agent, or Firm*—Seed and Berry LLP

[57] ABSTRACT

A configurable integrated circuit has first and second externally accessible terminals. A configuration circuit has an input terminal coupled to the first externally accessible terminal and also has an output terminal. The configuration circuit receives a configuration input signal that represents a configuration and generates a configuration output signal that enables the represented configuration. A configuration indicator has an input terminal that is coupled to the output terminal of the configuration circuit and has an output terminal that is coupled to the second externally accessible terminal. The configuration indicator receives the configuration output signal from the configuration circuit and generates on the second externally accessible terminal an indicate signal that identifies the enabled configuration. The configuration circuit may include a plurality of output terminals and receive a configuration input signal that represents one or more configurations. The configuration circuit generates a plurality of configuration output signals that each enable a corresponding one of the one or more configurations when a corresponding configuration output signal has an active state. The configuration indicator receives the configuration output signals and generates on the second externally accessible terminal an indicate signal that indicates a number of the enabled configurations.

25 Claims, 9 Drawing Sheets

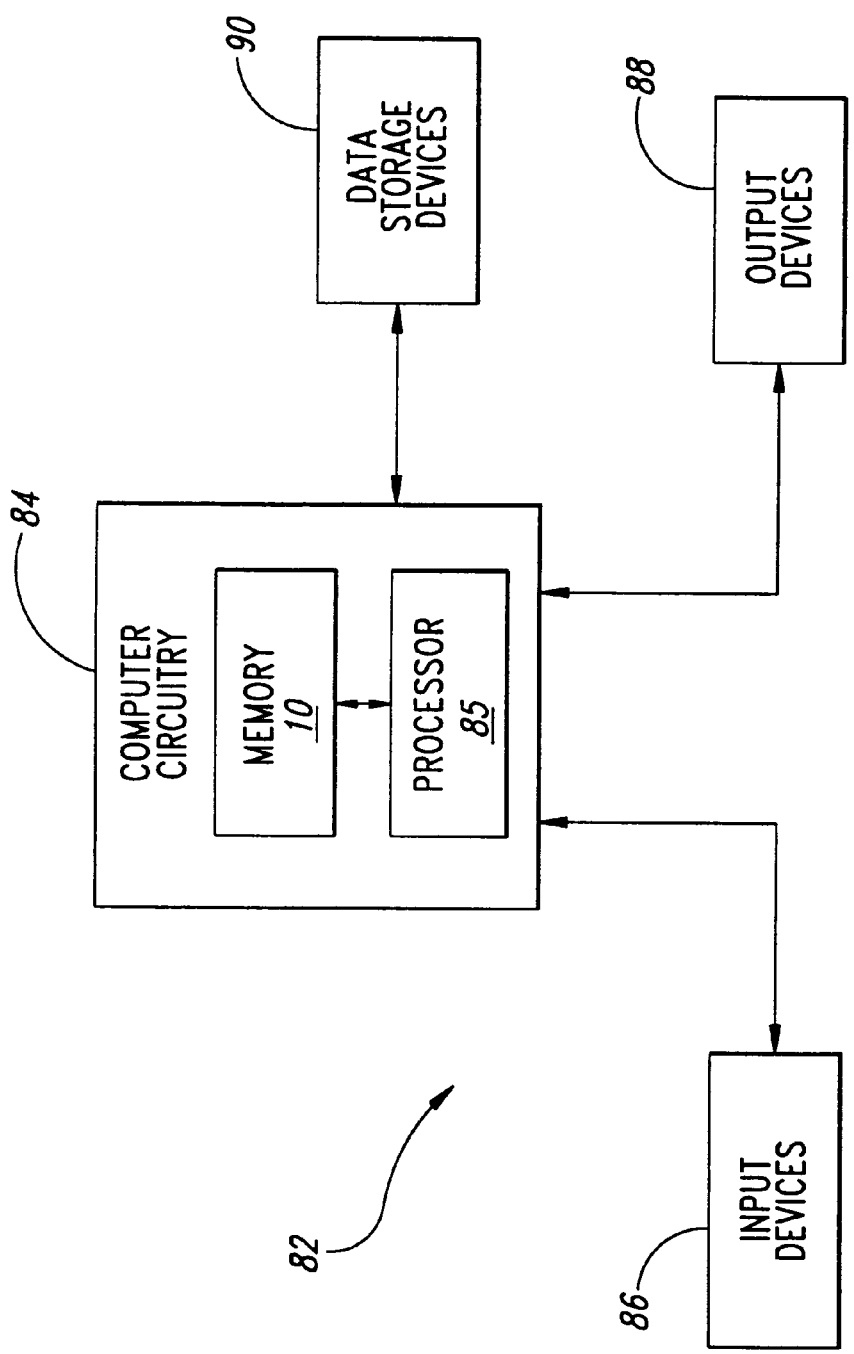

SYSTEM FOR GENERATING CONFIGURATION OUTPUT SIGNAL RESPONSIVE TO CONFIGURATION INPUT SIGNAL, ENABLING CONFIGURATION, AND PROVIDING STATUS SIGNAL IDENTIFYING ENABLED CONFIGURATION RESPONSIVE TO THE OUTPUT SIGNAL

TECHNICAL FIELD

The present invention relates generally to integrated circuits, and more specifically to a configurable integrated circuit that has a configuration circuit for identifying an enabled configuration or for indicating a number of enabled configurations, and to methods for so identifying and indicating.

BACKGROUND OF THE INVENTION

Today, many integrated circuits, such as memories and microprocessors, are configurable in one or more modes or configurations. Typically, such a circuit receives a mode or configuration signal, and in response thereto, implements, i.e., enables, the mode or configuration that the signal represents, i.e., identifies. For example, a memory device may be configurable in eight different test configurations, one of which is a charge-pump test mode, and have three configuration pins that receive a 3-bit digital configuration signal from an external device, such as a testing apparatus. While configured in the charge-pump test mode, the memory device couples the normally inaccessible output voltage of an internal charge pump to an external pin for measurement by a testing apparatus. In response to this state of the configuration signal, the memory device activates internal circuitry, such as multiplexers and switches, that couples the output node of the charge pump to a selected external pin. The testing apparatus can then measure the voltage at the external pin and determine whether or not the charge pump is operating properly. After it has finished checking the memory device, the testing apparatus generates the configuration signal having a state that represents an operational or normal configuration. In response to this state, the memory device enables itself in the normal configuration.

A problem with existing configurable integrated circuits is that it is often difficult or impossible to determine which configuration or configurations are enabled in the circuit. Of course, one can record the state or sequence of states of the configuration signal that the integrated circuit receives, and determine from this state or sequence of states the current configuration or configurations that the circuit should have enabled. However, a transmission error, such as a software glitch, noise glitch, or a loose electrical connection, may cause the circuit to receive an undesired and unrecorded configuration state. Thus, the possibility of such transmission errors makes this recording procedure unreliable.

Furthermore, because it is difficult to accurately determine the configurations that are enabled in an integrated circuit, the debugging procedures that one uses to determine the cause of a problem or failure detected in the circuit are often complex and relatively inaccurate. With reference to the charge-pump example, if the testing apparatus finds that the voltage at the external pin is unacceptable for a charge-pump voltage, there exist multiple possible causes of the unacceptable voltage. A first possibility is that the charge pump is defective. A second possibility is that the configuration circuitry of the integrated circuit is defective. A third possibility is that the testing apparatus inadvertently instructed the circuit to enable a configuration other than the charge-pump test mode. Thus, without knowing which configurations that the circuit has actually enabled, one must often use a complex or relatively unreliable debugging procedure to determine if the charge pump is truly defective, or if the integrated circuit failed to enable the proper configuration.

For example, one debugging procedure for determining the cause of such a detected problem or failure is to input to the circuit the proper state of the configuration signal in an attempt to reconfigure the circuit. Such a procedure, however, works only if the proper configuration state is known, and if neither the configuration circuitry nor the charge pump is defective. Another procedure is to physically probe the internal nodes of the integrated circuit. Such probing, however, is often costly and time consuming, and may be impractical or even impossible once the circuit has been packaged.

SUMMARY OF THE INVENTION

In accordance with one aspect of the present invention, a configurable integrated circuit is provided having a configuration input pin and a configuration output pin. The integrated circuit includes a configuration circuit having an input terminal coupled to the configuration input pin and also has an output terminal. The configuration circuit receives a configuration input signal that identifies a configuration and generates a configuration output signal that enables the identified configuration. The integrated circuit also includes a configuration indicator having an input terminal that is coupled to the output terminal of the configuration circuit and has an output terminal that is coupled to the configuration output pin. The configuration indicator receives the configuration output signal from the configuration circuit and generates on the configuration output pin an indicator signal that identifies the enabled configuration.

In another aspect of the invention, the configuration circuit has a plurality of output terminals and receives a configuration input signal that identifies one or more configurations. The configuration circuit generates a plurality of configuration output signals that each enable a corresponding one of the configurations when the configuration output signal has an active state. The configuration indicator receives the configuration output signals and generates on the configuration output pin an indicate signal that indicates a number of the enabled configurations.

An advantage provided by the present invention is an integrated circuit that generates a signal that can identify the enabled configuration or configurations, or can indicate how many of the configurations supported by the circuit are currently enabled. This information can significantly simplify procedures used to debug the integrated circuit.

BRIEF DESCRIPTION OF THE DRAWINGS

FIG. 13 is a block diagram of a computer system that includes the memory circuit of FIG. 1.

DETAILED DESCRIPTION OF THE INVENTION

Figure 1:
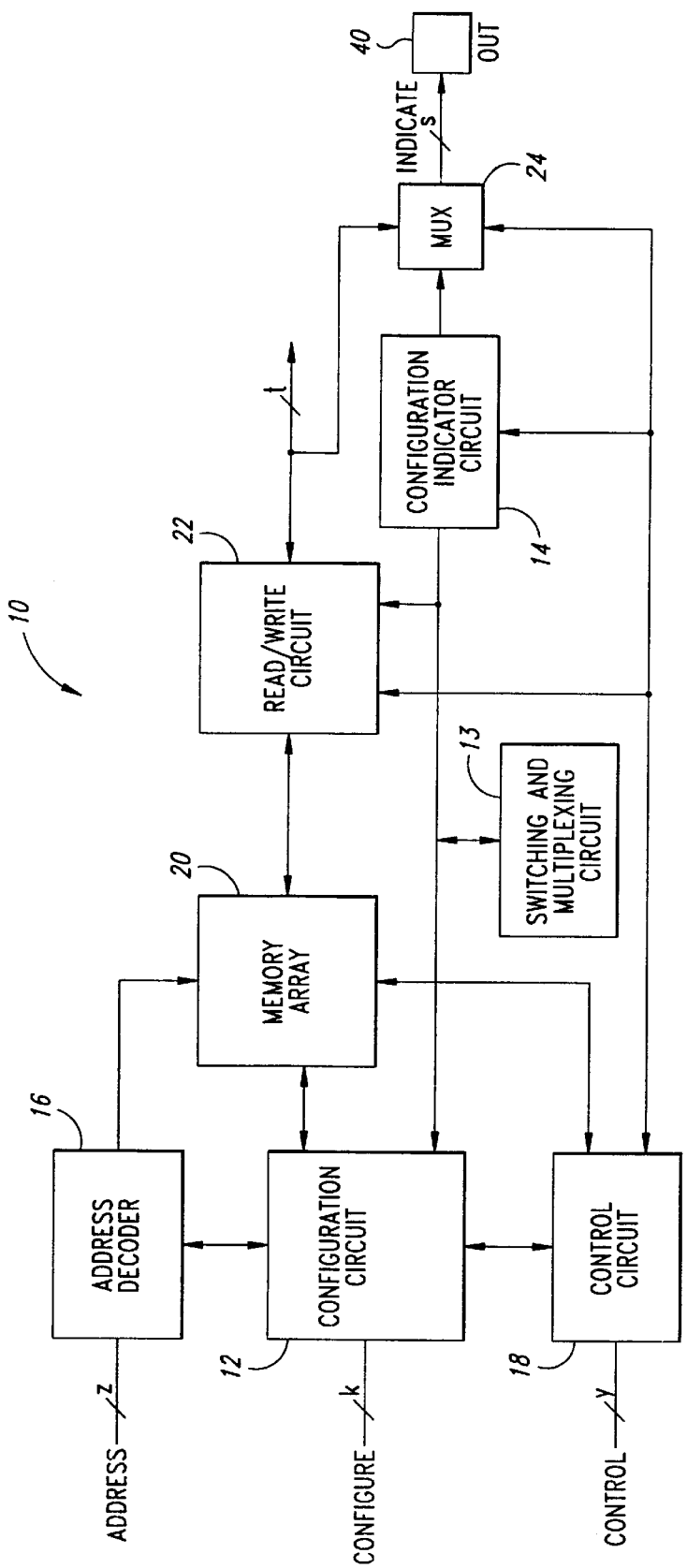
FIG. 1 is a block diagram of a memory device according to the present invention.

FIG. 1 is a block diagram of a memory device 10 that is structured and operates according to a preferred embodiment of the present invention. In one aspect of the invention, the memory 10 is a dynamic random access memory (DRAM). Generally, the memory device 10 includes k configuration pins, where k≧1. The configuration pins are coupled to a configuration bus. A configuration circuit 12 coupled to the configuration bus receives a configuration input signal therefrom, and generates one or more configuration output signals that control switching and multiplexing circuitry 13. The multiplexing circuitry 13 configures the memory device 10 in one or more desired modes or configurations. A configuration decoder or indicator circuit 14 also receives the configuration output signals, and provides on an indicator bus a status or indicator signal that identifies which or how many of the possible configurations that the configuration circuit 12 is currently enabling. The indicator bus has s configuration output lines (s≧1) that are coupled through a multiplexer 24 to externally accessible output pins 40. For clarity, one external output pin 40 is shown in FIG. 1.

By providing the indicator signal, the memory circuit 10 can greatly simplify the debugging procedures that are used to determine the cause of a problem with the memory device 10. Furthermore, the indicator circuit 14 can be constructed to provide the configuration information on fewer nodes than the number of possible configurations. In a preferred embodiment of the invention, the configuration information is provided on only one external configuration output pin 40.

In operation while the memory 10 is in a standard or normal configuration, a conventional address decoder 16 receives an address from a z-line address bus (z≧1), and activates a memory cell in a conventional memory array 20 that corresponds to the address. A conventional control circuit 18 receives an externally generated signal on a y-line control bus (y≧1) and provides control signals that indicate to the memory array 20 and a conventional read/write circuit 22 whether a data read or a data write is being performed. During a read cycle, the read/write circuit 22 couples the data from the addressed memory cell in the array 20 through the multiplexer 24 to the data bus, and during a write cycle, the read/write circuit 22 couples the data from the data bus and multiplexer 24 to the addressed memory cell.

During a configuration sequence, the configuration circuit 12 receives an externally generated configuration signal on the configuration bus and generates configuration output signals that cause the circuitry 13 to configure the memory device 10 in a particular configuration or for operation in a particular mode. For example, during testing, the configuration circuit 12 may generate the appropriate configuration output signals such that the circuitry 13 couples the output voltage of an internal charge pump to a selected external pin. Or, during normal operation, the configuration circuit 12 may generate the appropriate configuration output signals such that the circuitry 13 configures the memory device 10 to operate in a particular data mode, such as a conventional DRAM burst mode. The indicator circuit 14 converts the configuration output signals into an indicator signal that provides information as to the identity or number of the active, i.e., enabled configurations. If the memory device 10 has an insufficient number of external pins to provide dedicated indicator pins, multiplexer 24 couples the indicator signal from the indicator circuit 14 to the selected external pin or pins during a configuration read mode, and couples other signals, such as data signals, to the same pin or pins when the configuration information is not being accessed.

It will be apparent to one skilled in the art that many variations of the components illustrated in FIG. 1 are possible. For example, the indicator 14, address decoder 16, control circuit 18, memory array 20, read/write circuit 22, or multiplexer 24 may include portions of the switching and multiplexing circuitry 13, which is thus distributed among one or more of these circuit blocks. In such an embodiment, the configuration circuit 12 is coupled to each of these circuit blocks. Where the circuitry 13 is not so distributed, the configuration circuit 12 need only be coupled to the circuitry 13 and the indicator circuit 14, and the address decoder 16, control circuit 18, memory array 20, read/write circuit 22, or multiplexer 24 are typically coupled to the switching and multiplexing circuitry 13.

Figure 2:
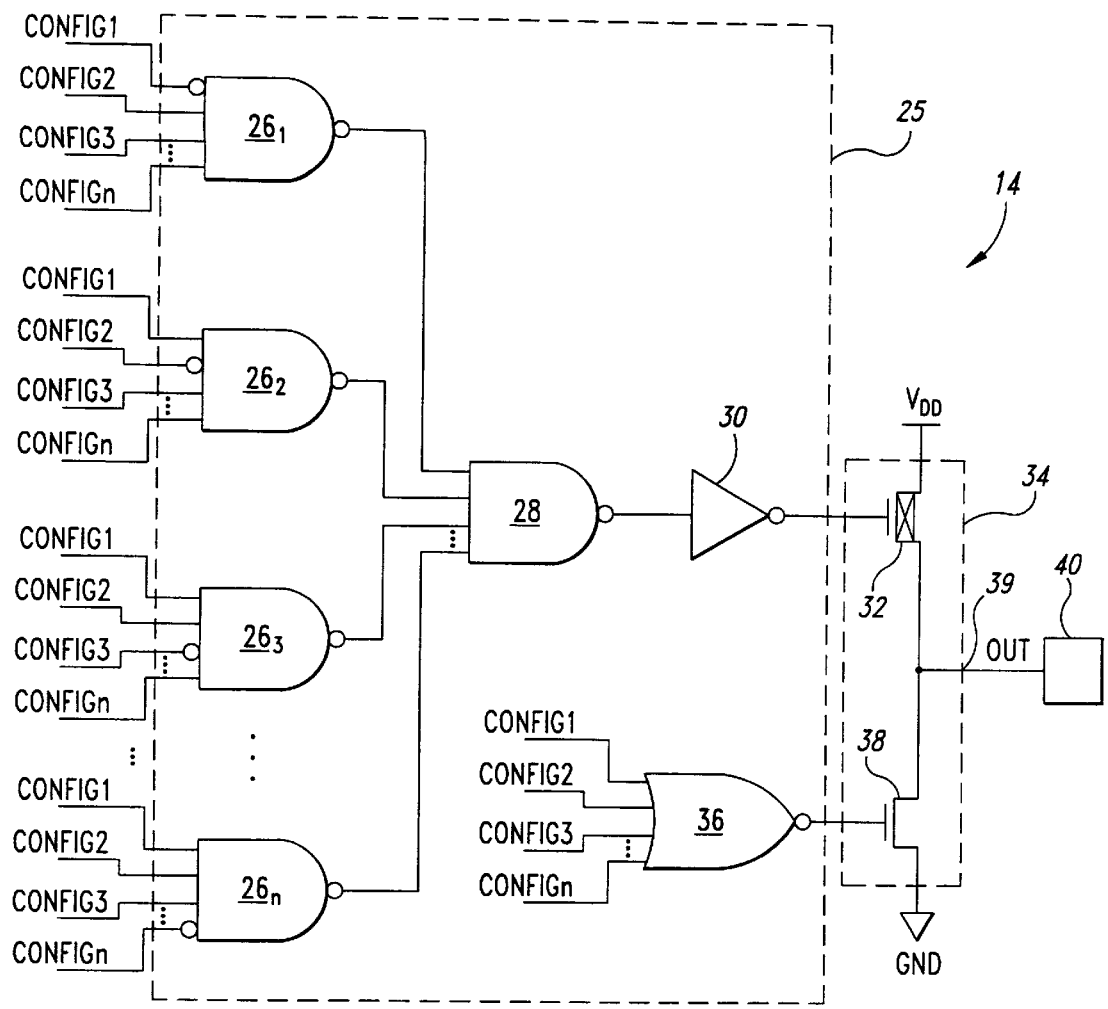
FIG. 2 is a schematic diagram of a first embodiment of the indicator circuit of FIG. 1.
Figure 3:
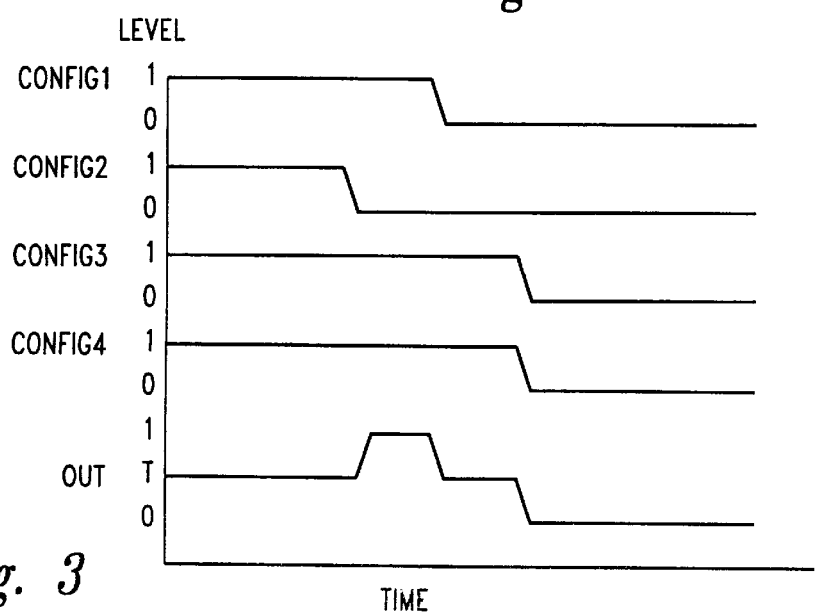
FIG. 3 is a timing diagram of signals shown in FIG. 2.

FIG. 2 is a schematic diagram of one embodiment of the indicator circuit 14 of FIG. 1, and FIG. 3 is a timing diagram showing the output of the indicating circuit 14 responsive to its configuration input signals. The indicator circuit 14 includes a logic circuit 25 and an output driver stage 34 that is coupled thereto. The logic circuit 25 receives from the configuration circuit 12 (FIG. 1) a number of configuration output signals, Config1–Confign, where n is an arbitrary integer value. In one aspect of the invention, n equals the number of configurations that the memory device 10 can enable. For example purposes, n=4, a high logic level, i.e., logic 1, for a configuration output signal indicates that the corresponding configuration is inactive, i.e., disabled, and a low logic level, i.e., logic 0, for a configuration output signal indicates that the corresponding configuration is enabled. That is, the configuration output signals Config1–Confign are active low.

The configuration output signals are coupled to the input terminals of NAND gates $26_1$–$26_n$. Each NAND gate 26 has one of its n input terminals inverted, such that each of the signals Config1–Confign is coupled to an inverting input of one of the NAND gates 26. Thus, one of the NAND gates 26 will have a logic 0 output if its corresponding Config input, but no other Config input, is a logic low. For example, if Config1 coupled to the inverting input terminal of the NAND gate $26_1$ is logic 0 and Config2–n are logic 1, then the output of the NAND gate 26, will be logic 0. If any other Config signal, e.g., Config3, is also logic 0, then the output of the NAND gate 26 will be logic 1. In summary, the NAND gates $26_1$–$26_N$ decode the configuration inputs by causing the output of one NAND gate $26_1$–$26_N$ to be logic 0 if its corresponding configuration input, but no other configuration input, is a logic 0.

The output terminals of the NAND gates $26_1$–$26_n$ are coupled to the n input terminals of a NAND gate 28. The output of the NAND gate 28 will be logic 1 if the output of any one or more of the NAND gates $26_1$–$26_n$ is a logic 0. Thus, the NAND gates $26_1$–$26_n$ and 28 essentially perform an "or" function of outputting a logic 1 if any one of the Config1–Config4, but not more than one, is a logic 0. The output terminal of the NAND gate 28 is coupled to the input terminal of an inverter 30. The output terminal of the inverter 30 is coupled to the control terminal of a PMOS transistor 32, which is part of the driver stage 34. The PMOS transistor 32 is turned on to drive the output terminal 39 to logic 1 whenever the output of the inverter 30 is logic 0 caused by the output of the NAND gate being logic 1. Thus, the output terminal 39 will be a logic 1 whenever one, but not more than one, Config1–Confign signal is logic 0.

The Config1–Confign signals are also coupled to the n input terminals of a NOR gate 36. The NOR gate 36 essentially performs an "and" function by outputting a logic 1 if all of the Config1–Confign signals are a logic 0. If fewer than all of the Config1–Confign signals are a logic 0, i.e., one or more of Config1–Confign are logic 1, then the output of the NOR gate 36 is a logic 0.

The output of the NOR gate 36 is applied to the gate of an NMOS transistor 38 in the driver circuit 34. The transistor 38 is turned on to drive the output terminal 39 to ground whenever the output of the NOR gate 36 is logic 1. Thus, the output terminal 39 is at logic 0 when all of the Config1–Confign signals are at logic 0.

As mentioned above, the PMOS transistor 32 is turned on whenever any one, but not more than one, of the Config1–Confign signals are at logic 0. Since the NMOS transistor 38 is turned on only when all of the Config1–Confign signals are at logic 0, neither of the transistors 32 and 38 is turned on for all other conditions. Thus, the output terminal 39 is tristated at a high impedance if either none or more than one but fewer than all of the Config1–Confign signals are at logic 0.

The driver stage 34 provides the indicator signal, shown as signal OUT, to the indicator bus. In a preferred embodiment of the invention, the stage 34 provides the indicator signal to a single external pin 40 of the memory device 10. For clarity, FIG. 2 illustrates this preferred embodiment. The multiplexer 24 (FIG. 1) is omitted from FIG. 2, as well as from FIGS. 4, 6, and 11 discussed below, for clarity.

In summary, referring to the timing diagram of FIG. 3, the indicator circuit 14 of FIG. 2 generates for the signal OUT a tristate level T if the configuration circuit 12 enables either none of the configurations or more than one but less than all of the configurations, logic 1 if the circuit 12 enables one and only one of the configurations, and logic 0 if the circuit 12 enables all of the configurations.

FIG. 3 illustrates one embodiment of the logic circuit 25 and the driver stage 34 that operate as discussed above in conjunction with FIG. 2. It is understood that one may construct other logic circuits and driver stages that operate in a similar manner.

Figure 4:
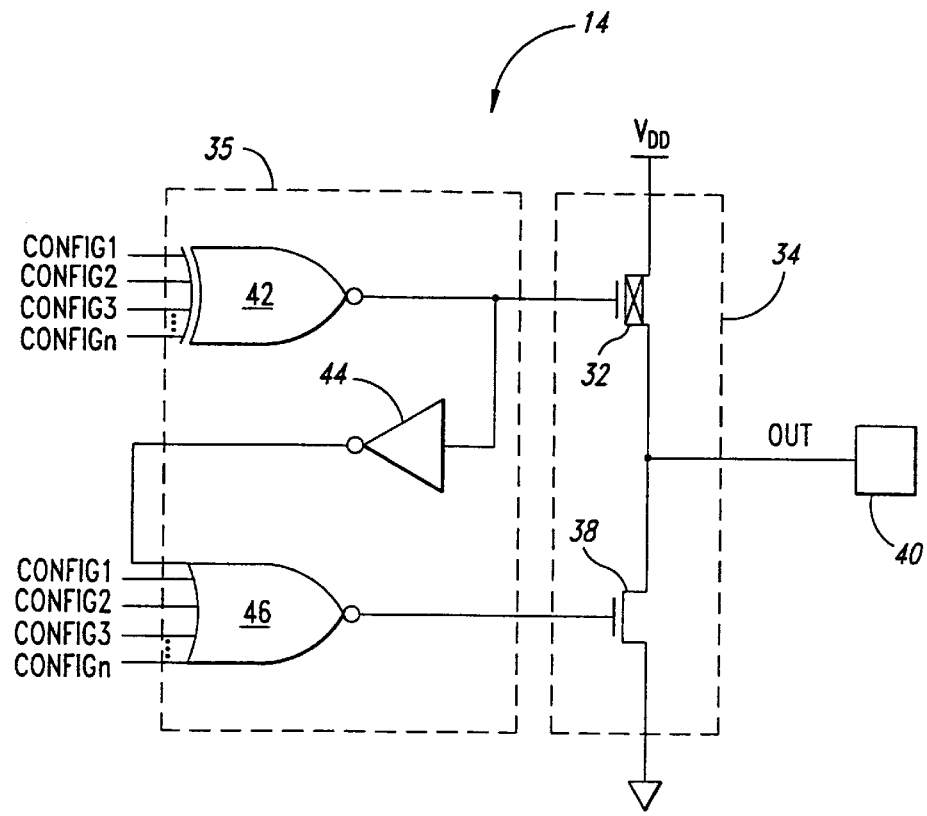
FIG. 4 is a schematic diagram of a second embodiment of the indicator circuit of FIG. 1.

FIG. 4 is a schematic diagram of a second embodiment of the indicator circuit 14 of FIG. 1. The indicator circuit 14 of FIG. 4 includes a logic circuit 35, which receives the signals Config1–Confign, and the driver stage 34 of FIG. 2, which is coupled to the logic circuit 35 and includes the transistors 32 and 38. The logic circuit 35 includes an n-input EXCLUSIVE NOR (XNOR) gate 42, which is coupled to receive Config1–Confign. The output of the XNOR gate 42 is coupled to the input of an inverter 44. The output of the inverter 44 is coupled to an (n+1)-input NOR gate 46, which is also coupled to receive Config1–Confign. The control terminal of the switch 32 is coupled to the output of the XNOR gate 42, and the control terminal of the switch 38 is coupled to the output of the NOR gate 46.

Figure 5:
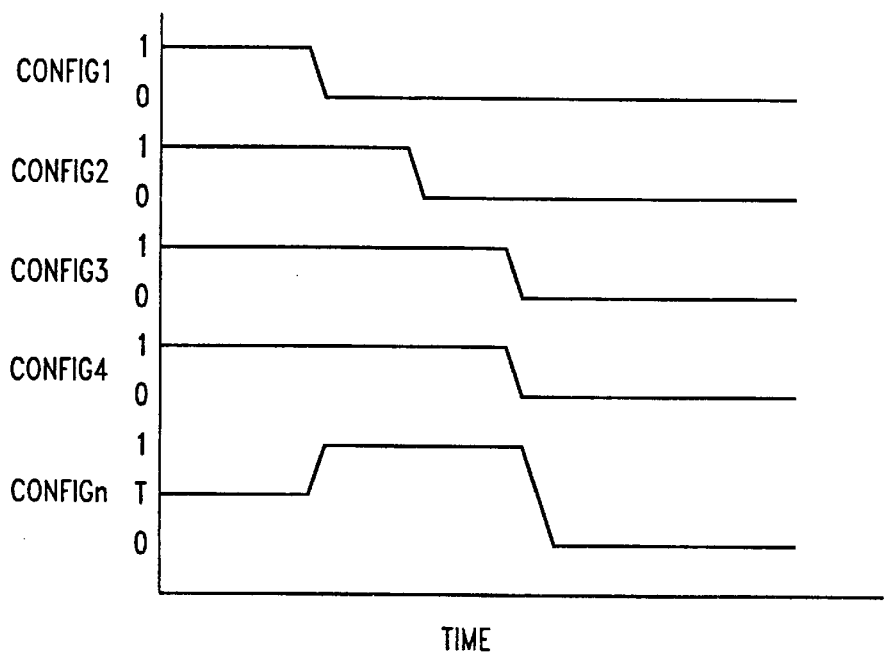
FIG. 5 is a timing diagram of signals shown in FIG. 4.

FIG. 5 is a timing diagram of the signals of FIG. 4. For example purposes, n=4 and the configuration output signals Config1–Config4 are active low. If none of the signals Config1–Config4 equals logic 0, then the indicator output of the XNOR gate 42 is logic 1 thereby turning off the PMOS transistor 32 and causing NOR gate 46 to output a logic 0 to turn off the NMOS transistor 38. Thus, if none of the Config1–Confign signals is a logic 0, then the circuit 14 generates OUT equal to a tristate level. If one or more but less than all of the configuration output signals, such as Config1, equals either a logic 0 or a logic 1 (i.e., the Config signals are a mixture of 0's and 1's), then the XNOR gate 42 outputs a logic 0 to turn on the PMOS transistor 32 and the NOR gate 46 outputs a logic 0 to turn off the NMOS transistor 38. Thus, if one or more, but less than all, of the Config1–Confign signals is logic "0" the indicator 14 generates OUT equal to logic 1. If all the configuration output signals equal logic 0, then the XNOR gate 42 is a logic 1, which switches off the PMOS transistor 32, and the output of the NOR gate is a logic 1, which switches on the NMOS transistor 38. Thus, if all of the Config1–Confign signals are logic 0, the indicator 14 generates OUT equal to logic 0.

In summary, the indicator circuit 14 of FIG. 4 generates for the signal OUT a tristate level if the configuration circuit 12 enables none of the configurations, logic 1 if the circuit 12 enables at least one but not all of the configurations, and logic 0 if the circuit 12 enables all of the configurations.

Figure 6:
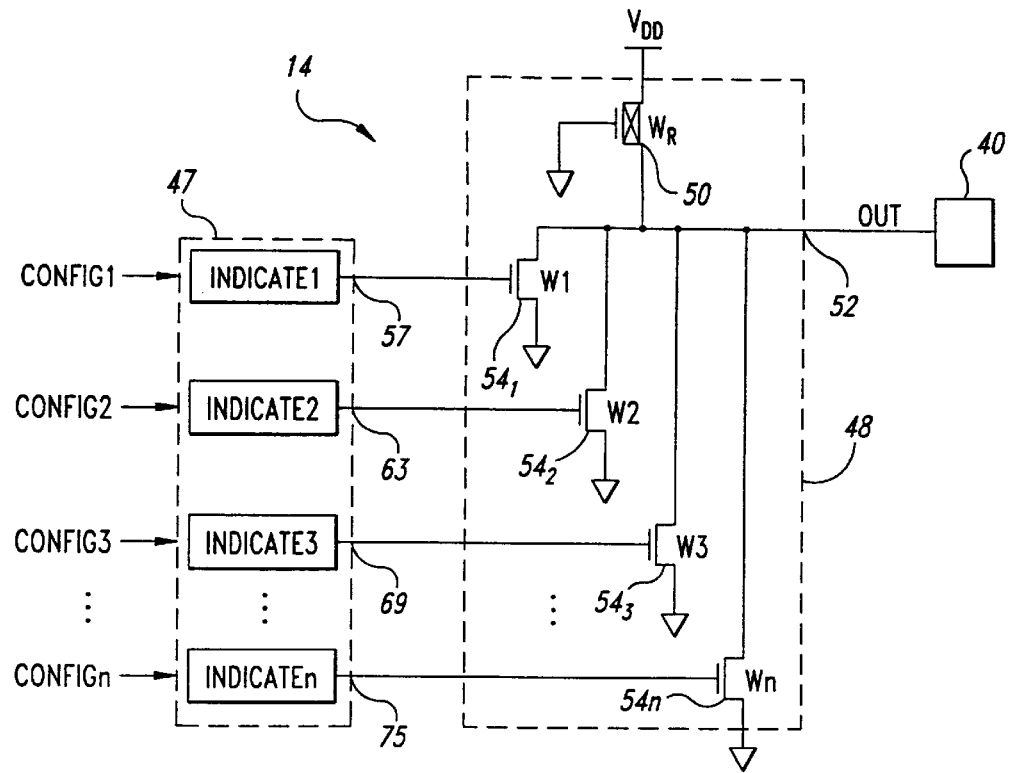
FIG. 6 is a schematic diagram of a third embodiment of the indicator circuit of FIG. 1.

FIG. 6 is a schematic diagram of a third embodiment of the indicator circuit 14 of FIG. 1. The indicator circuit 14 includes a logic circuit 47 and a voltage-divider circuit 48. The logic circuit 47 is coupled to receive the configuration output signals Config1–Confign, and includes a number of indicator modules Indicate1–Indicaten. Each indicator module receives a corresponding one of the configuration output signals. For example, the module Indicate1 receives Config1, Indicate2 receives Config2, and Indicaten receives Confign. The outputs of the modules Indicate1–Indicaten are respectively coupled to output terminals 57, 63, 69, and 75 of the logic circuit 47.

The input terminals of the voltage-divider circuit 48 are respectively coupled to the output terminals 57, 63, 69, and 75 of the logic circuit 47. The divider circuit 48 includes a load 50 that is coupled between a first power-supply terminal, which is coupled to $V_{DD}$, and an output terminal 52, which is coupled to the external pin 40. The divider circuit 48 also includes switchable loads $54_1$–$54_n$, which each have a different on-state, i.e., active-state, impedance. Each switchable load 54 includes a switchable path that is coupled between the output terminal 52 and a second power-supply terminal, which is coupled to ground. The control terminal of each of the switchable loads 54 is coupled to the output of a corresponding indicator module. In one aspect of the invention, the load device 50 is a PMOS transistor that has its gate grounded and has a width-to-length ratio, $W_R/L_R$, that gives the transistor 50 a desired impedance. For clarity and example purposes, the channel length $L_R$=1 micron ($\mu$m), and thus the width-to-length ratio=$W_R$. Similarly, the switchable loads $54_1$–$54_n$ are NMOS transistors that each have a different width-to-length ratio $W_1$–$W_n$ respectively, where $L_1$–$L_n$=1 $\mu$m. The gate of each of the NMOS transistors is the control terminal, and thus is coupled to a corresponding indicator module as discussed above.

In operation, the logic circuit 47 activates combinations of the switchable loads $54_1$–$54_n$ that correspond to combinations of enabled configurations. The divider circuit 48 provides at the output terminal 52 the signal OUT having a different voltage level for each of the recognized combinations. Thus, by reading the voltage levels, one can determine how many or which configurations the configuration circuit 12 (FIG. 1) has enabled.

FIGS. 7A–7D are schematic diagrams of a first embodiment of the modules Indicate1–Indicaten, respectively.

Figure 7A:
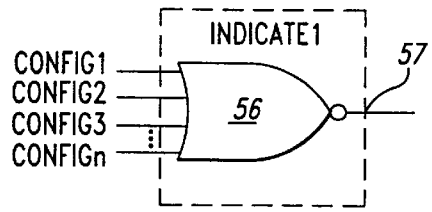
FIGS. 7A–7D are schematic diagrams of a first embodiment of the indicator modules of FIG. 6.

Referring to FIG. 7A, the module Indicate1 includes an n-input NOR gate 56, which receives the signals Config1–Confign. The output of the NOR gate 56 is logic 1 only if all of the Config1–Confign signals are logic 0. If any of the Config1–Confign signals are logic 1, the output of the NOR gate is logic 0. The output of the NOR gate 56 is coupled to the control terminal of the switchable load $54_1$ (FIG. 6). The switchable load 54 turns on whenever the output of the NOR gate 56 is a logic 1, i.e., all of the Config1–Confign signals are logic 0.

Figure 7B:
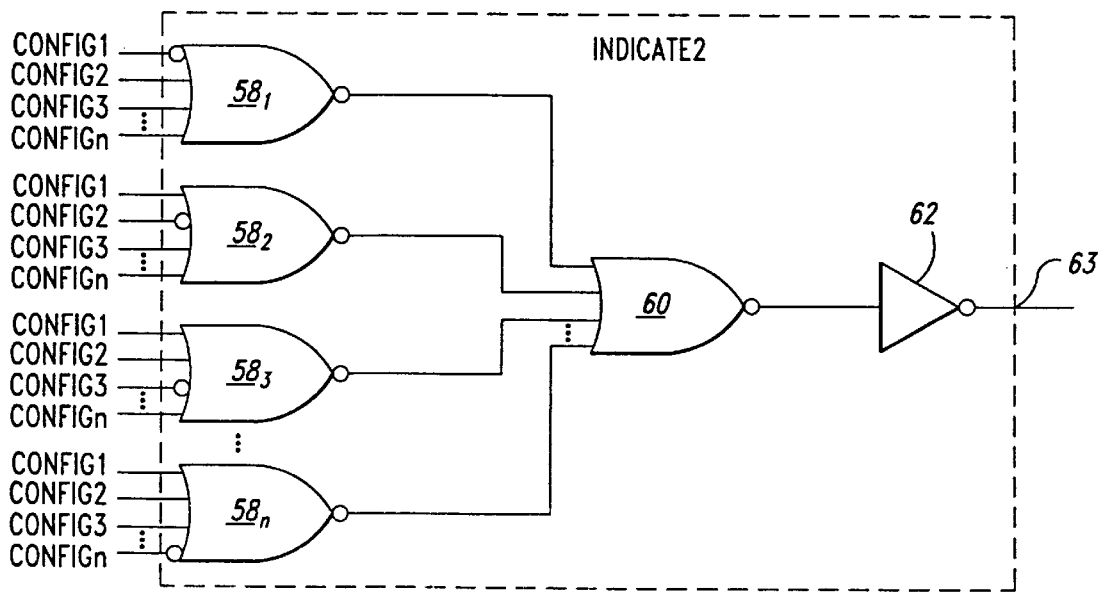

Referring to FIG. 7B, the module Indicate2 includes n-input NOR gates $58_1$–$58_n$, which each receive Config1–Confign. Each NOR gate 58 has an inverting input terminal, such that each signal Config1–Confign is coupled to one of the inverting terminals. The outputs of the NOR gates $58_1$–$58_n$ are at logic 0 except when any n−1 of the Config1–Confign signals are at logic 0. When any n−1 of these signals equal logic 0, then one of the NOR gates $58_1$–$58_n$ outputs a logic 1. The outputs of the NOR gates $58_1$–$58_n$ are coupled to the n inputs of a NOR gate 60. The output of the NOR gate 60 is a logic 0 if any one of the NOR gates $58_1$–$58_n$ outputs a logic 1. The output of the inverter 62 is coupled to the output terminal 63 through an inverter 62. The output terminal is coupled to the control terminal of the switchable load $54_2$ which is turned on by a logic 1 at the output of the inverter 62. Thus the switchable load $52_2$ will be turned on if any n−1 of the Config1–Confign signals are a logic 0.

Figure 7C:
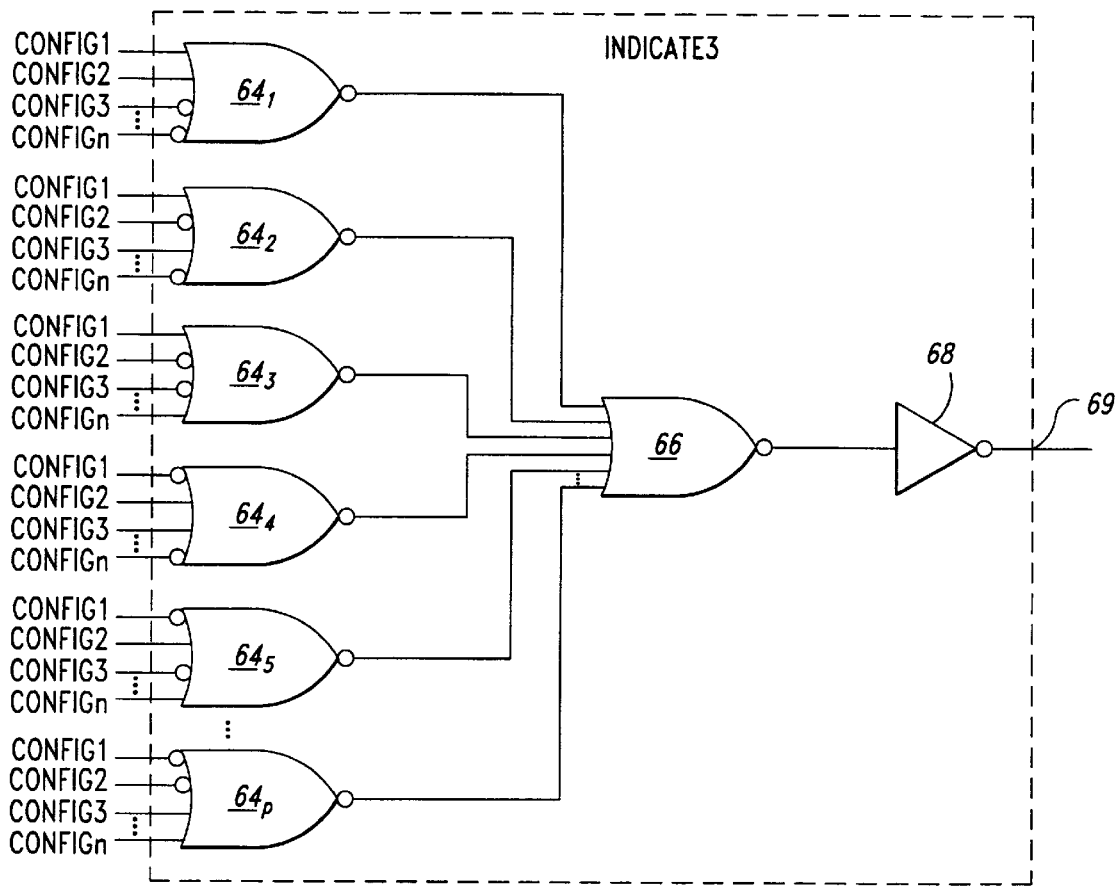

Referring to FIG. 7C, the module Indicate3 includes p n-input NOR gates $64_1$–$64_p$, where p equals the number of all possible pairs of the configuration output signals Config1–Confign. For example, if n=4, there are p=six possible pairs of the signals Config1–Config4. These six pairs are Config1/Config2, Config1/Config3, Config1/Config4, Config2/Config3, Config2/Config4, and Config3/Config4. Each of the NOR gates 64 has a pair of inverted input terminals, such that a different pair of the signals Config1–Confign is coupled to the two inverting terminals of each of the NOR gates 64. Thus, when n−2 of the signals Config1–Confign equal logic 0, then one of the NOR gates $64_1$–$64_p$ outputs a logic 1, while the remaining NOR gates $64_1$–$64_p$ output a logic 0. When more or fewer than n−2 of the signals Config1–Confign are logic 0, then all of the NOR gates $64_1$–$64_p$ output a logic 0. The outputs of the NOR gates 64 are coupled to the p inputs of a NOR gate 66, which has an output that is coupled to an inverter 68. The NOR gate 66 outputs a logic 0 when any one of the NOR gates $64_1$–$64_p$ outputs a logic 1. Thus, the module Indicate3 turns on the switchable load $54_3$ when any n−2 of the signals Config1–Config equal logic 0. In the example where n=4, the module Indicate3 turns on the load $54_3$ when any two of the signals Config1–Config4 equal logic 0. The output of the inverter 68 is coupled to the output terminal 69, which is coupled to the control terminal of the switchable load $54_3$.

Figure 7D:
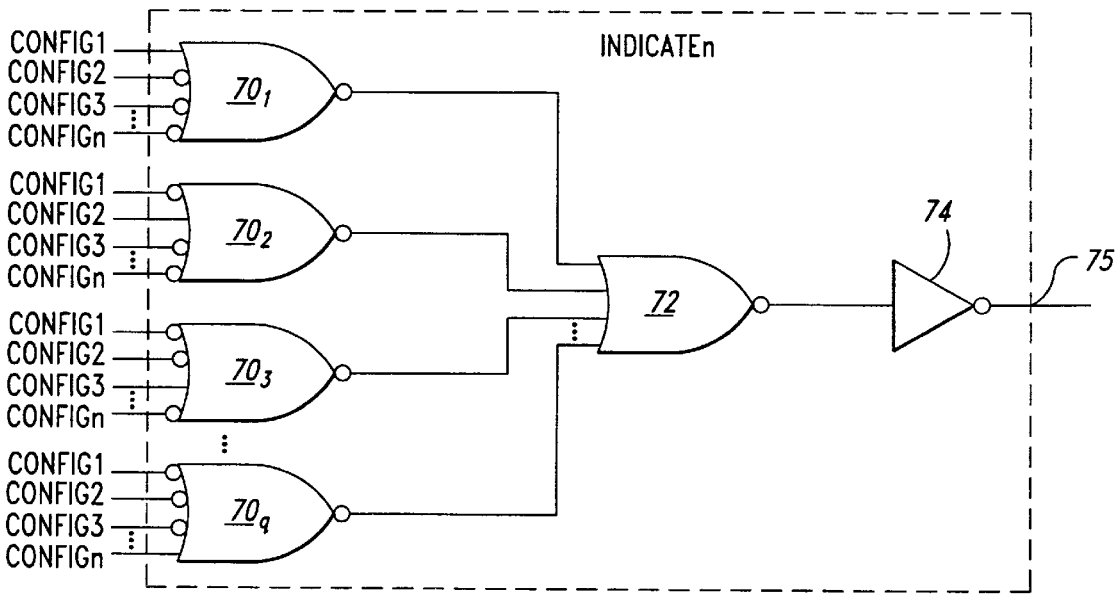

Referring to FIG. 7D, module Indicaten includes q NOR gates $70_1$–$70_q$, which each have n inputs coupled to receive the configuration output signals Config1–Confign. Q is the number of possible triplets of the signals Config 1–Confign. For example, where n=4, q=4. Each of the NOR gates 70 has three inverted input terminals, such that a different triplet of the signals Config1–Confign is coupled to the three inverting terminals of each of the NOR gates 70. Thus, when n−3 of the Config1–Confign signals equal logic 0, then one of the NOR gates $70_1$–$70_q$ outputs a logic 1. When more or fewer than n−3 of these signals equal logic 0, then all of the NOR gates $70_1$–$70_q$ output logic zeroes. Thus, where n=4, if any one and only one of the signals Config1–Config4, for example Config2 and only Config2, equal logic 0, then one of the NOR gates $70_1$–$70_q$ outputs a logic 1. The outputs of the NOR gates 70 are coupled to the q inputs of a NOR gate 72, which has an output that is coupled to an inverter 74. When one of the NOR gates $70_1$–$70_q$ outputs a logic 1, then the NOR gate 72 outputs a logic 0. When all of the NOR gates $70_1$–$70_q$ output a logic 0, then the NOR gate 72 outputs a logic 1. The output of the inverter 74 is coupled to the output terminal 75, which is coupled to the control terminal of the switchable load $54_n$. Thus, where n=4, the module Indicaten turns on the switchable load $54_n$ when any one and only one of the signals Config1–Config4 equals a logic 0.

Figure 8:
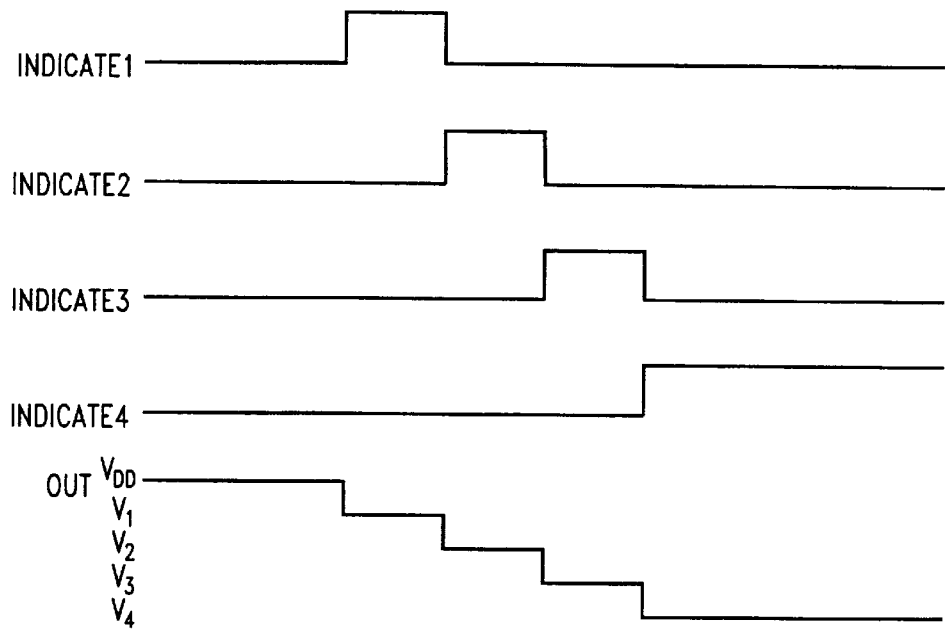
FIG. 8 is a timing diagram of signals shown in FIGS. 6 and 7A–7D.

FIG. 8 is a timing diagram showing the signal OUT that indicator circuit 14 of FIG. 6 generates, and the signals that the modules Indicate1–Indicaten of FIGS. 7A–7D respectively generate at the output terminals 57, 63, 69, and 75 of the circuit 14. For clarity, these signals are also labeled Indicate1–Indicaten. For example purposes, n=4 and Config1–Config4 are active low.

In operation and referring to FIGS. 6–8, if the configuration circuit 12 (FIG. 1) enables none of the configurations, i.e., Config1–Config4 equal logic 1, then the signals Indicate1–Indicate4 all equal logic 0. Thus, all the switchable loads $54_1$–$54_4$ are inactive and present a very high impedance to the output terminal 52. Therefore, the load 50 pulls OUT to a voltage approximately equal to $V_{DD}$.

If the configuration circuit 14 enables all of the configurations, i.e., Config1–Config4 equal logic 0, Indicate1 equals logic 1, and thus activates the switchable load $54_1$. Indicate2–Indicate4 equal logic 0, and thus deactivate the switchable loads $54_2$–$54_4$. Thus, OUT=V1=$V_{DD}(R_1/R_R+R_1)$, where $R_1$ and $R_R$ equal the respective impedances of the switchable load $54_1$ and the load 50. In an aspect of the invention where the switchable loads 54 are n-channel MOS transistors, the impedances R are proportional to the widths W. Thus, OUT=V1=$V_{DD}(W_1/W_R+W_1)$.

If the configuration circuit 14 enables any three configurations, i.e., three of the signals Config1–Config4 equal logic 0 and the remaining one of these signals equals logic 1, then Indicate2 equals logic 1, and thus activates the switchable load $54_2$. Indicate1 and Indicate3–Indicate 4 equal logic 0, and thus deactivate the switchable loads $54_1$ and $54_3$–$54_4$. Thus, OUT=V2=$V_{DD}(W_2/W_R+W_2)$.

If the configuration circuit 14 enables any two configurations, i.e., two of the signals Config1–Config4 equal logic 0 and the remaining two of these signals equals logic 1, then Indicate3 equals logic 1, and thus activates the switchable load $54_3$. Indicate1–Indicate2 and Indicate4 equal logic 0, and thus deactivate the switchable loads $54_1$–$54_2$ and $54_4$. Thus, OUT=V3=$V_{DD}(W_3/W_R+W_3)$.

If the configuration circuit 14 enables any one configuration, i.e., one of the signals Config1–Config4 equals logic 0 and the remaining three of these signals equals logic 1, then Indicate4 equals logic 1, and thus activates the switchable load $54_4$. Indicate1–Indicate3 equal logic 0, and thus deactivate the switchable loads $54_1$–$54_3$. Thus, OUT=V4=$V_{DD}(W_4/W_R+W_4)$.

Still referring to FIGS. 6–8, $W_1>W_2>W_3>W_4$ such that the indicator circuit 14 generates OUT having the voltage levels $V_{DD}$, V1, V2, V3, and V4 as shown. Other channel widths W, however, can be used for the load 50 and the switchable loads 54, as long as each switchable load 54, when active, generates a voltage at the output terminal 52 that is different from the voltages that the other switchable loads 54 generate when active.

Figure 9:
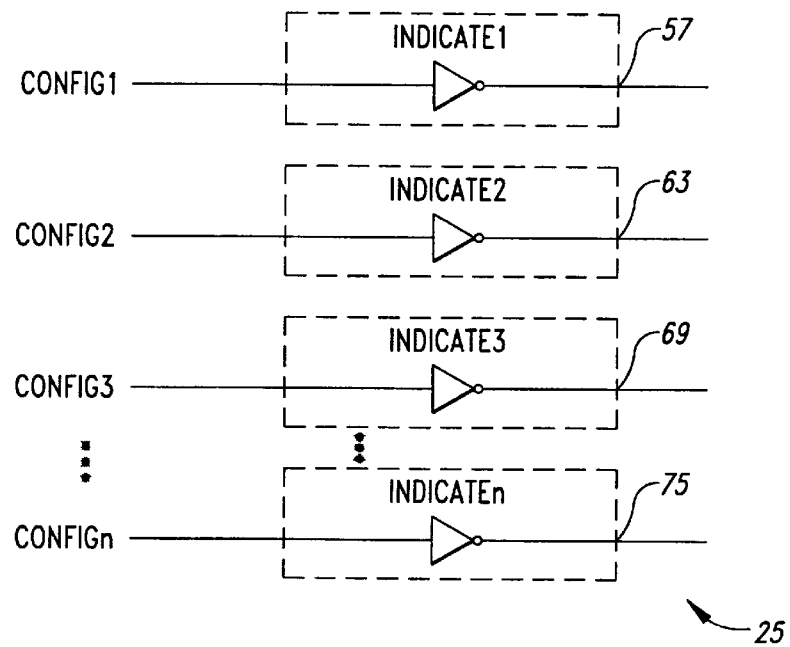
FIG. 9 is a schematic diagram of a second embodiment of the indicator modules of FIG. 6.

FIG. 9 is a schematic diagram of a second embodiment of the logic circuit 47 of FIG. 6. In this embodiment, the modules Indicate1–Indicaten each comprise an inverter that is coupled between a corresponding one of the configuration output signals Config 1–Config n and a corresponding one of the output terminals 57, 63, 69, and 75. Thus, the indicator circuit 14 not only indicates how many configurations that the configuration circuit 12 (FIG. 1) has enabled, but also identifies the enabled and disabled configurations.

Figure 10:
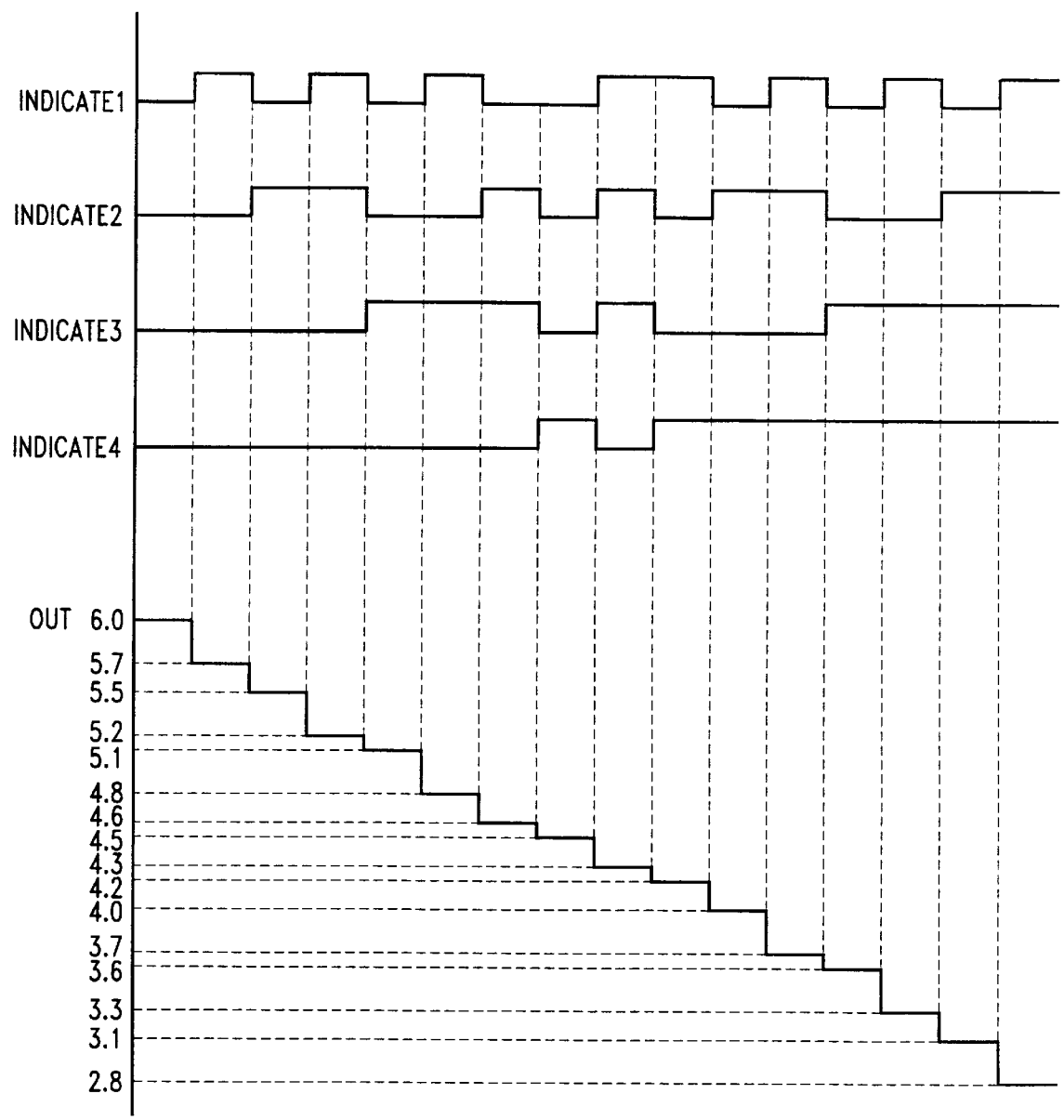
FIG. 10 is a timing diagram of signals shown in FIGS. 6 and 9.

FIG. 10 is a timing diagram of the signal OUT of FIG. 6 and the signals that modules Indicate1–Indicaten generate. For clarity, the module signals are also labeled Indicate1–Indicaten. In operation, the indicator circuit 14 generates a different voltage level for OUT for each possible combination of enabled configurations. For example purposes, n=4, $V_{DD}$=6.0 volts, Config1–Config4 are active low, and the channel widths $W_R$ and $W_1$–$W_4$ are selected so as to provide voltage levels for OUT that range from approximately 2.8 volts to $V_{DD}$. Other values of the channel widths $W_R$ and $W_1$–$W_4$ may be used to generate a different set of voltages for OUT, as long as a the indicator circuit 14 generates a different voltage level for each combination of enabled configurations.

More specifically, in operation and referring to FIG. 10, if the configuration circuit 12 (FIG. 1) enables none of the configurations, i.e., Config1–Config4 equal logic 1, then signals Indicate1–Indicate4 equal logic 0, and thus deactivate the switchable loads $54_1$–$54_4$. Thus, OUT is approximately $V_{DD}$, i.e., 6 volts. If the configuration circuit 12 enables the configuration corresponding to Config 1, i.e., Config1 equals logic 0 and Config2–Config4 equal logic 1, then Indicate1 equals logic 1, and thus activate the switchable load $54_1$. Indicate2–Indicate4 equal logic 0, and thus deactivate switchable loads $54_2$–$54_4$. The indicate circuit 14 thus generates OUT equal to approximately 5.7 volts. If the configuration circuit 12 enables the configuration corresponding to the Config 2, Indicate2 activates the switchable load $54_2$, and Indicate1 and Indicate3–Indicate4 deactivate the switchable loads $54_1$ and $54_3$–$54_4$. The indicate circuit 14 thus generates OUT equal to approximately 5.5 volts. If the configuration circuit 12 enables configurations corresponding to both Config1 and Config2, Indicate1 and Indicate2 activate the switchable loads $54_1$ and $54_2$, and Indicate3 and Indicate4 deactivate the switchable loads $54_3$ and $54_4$. The indicate circuit 14 thus generates OUT equal to approximately 5.2 volts. In a manner similar to that just described, and as shown in FIG. 10, the indicator circuit 14 generates OUT equal to a different voltage level for each possible combination of enabled configurations. By measuring the voltage level of OUT at the external pin 40, one can determine both the number and the identity of the enabled and disabled configurations. Furthermore, the indicator 14 provides this information on a single external pin 40.

Figure 11:
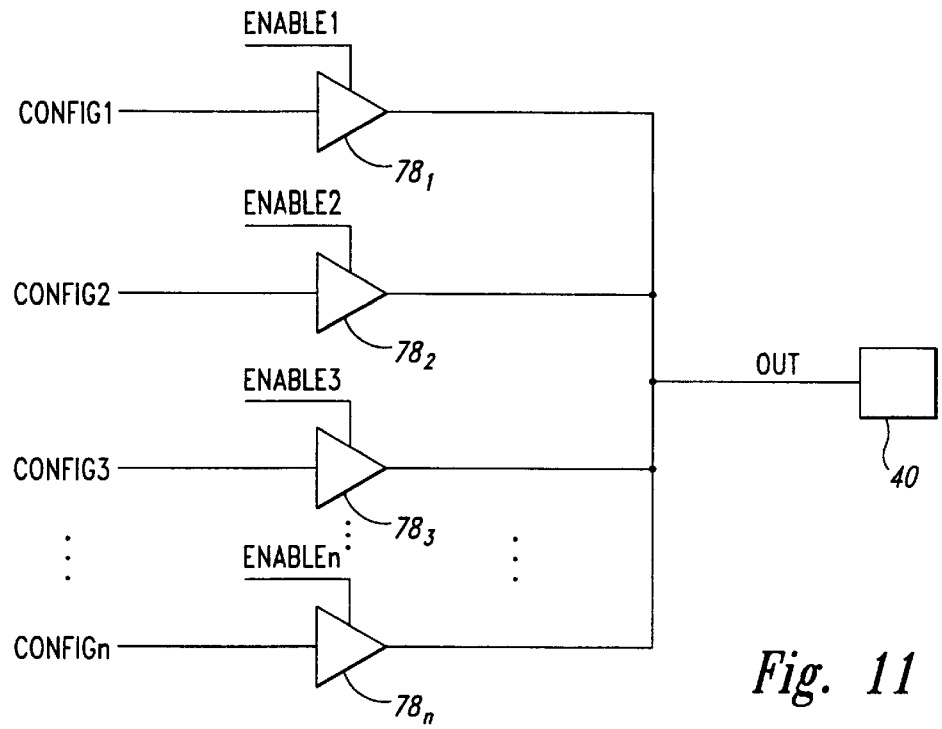
FIG. 11 is a schematic diagram of a fourth embodiment of the indicator circuit of FIG. 1.

FIG. 11 is a fourth embodiment of the indicator circuit 14 of FIG. 1. Each of the signals Config1–Confign are coupled to the input of a tristatable buffer $78_1$–$78_n$, respectively. The output terminal of each of the buffers 78 is coupled to the external pin 40 via the indicator bus. The enable terminals of the buffers 78 are each coupled to a corresponding output of the control circuit 18 (FIG. 1), which provides signals Enable1–Enablen to sequentially apply each of the Config1–Confign signals to the external pin 40.

Figure 12:
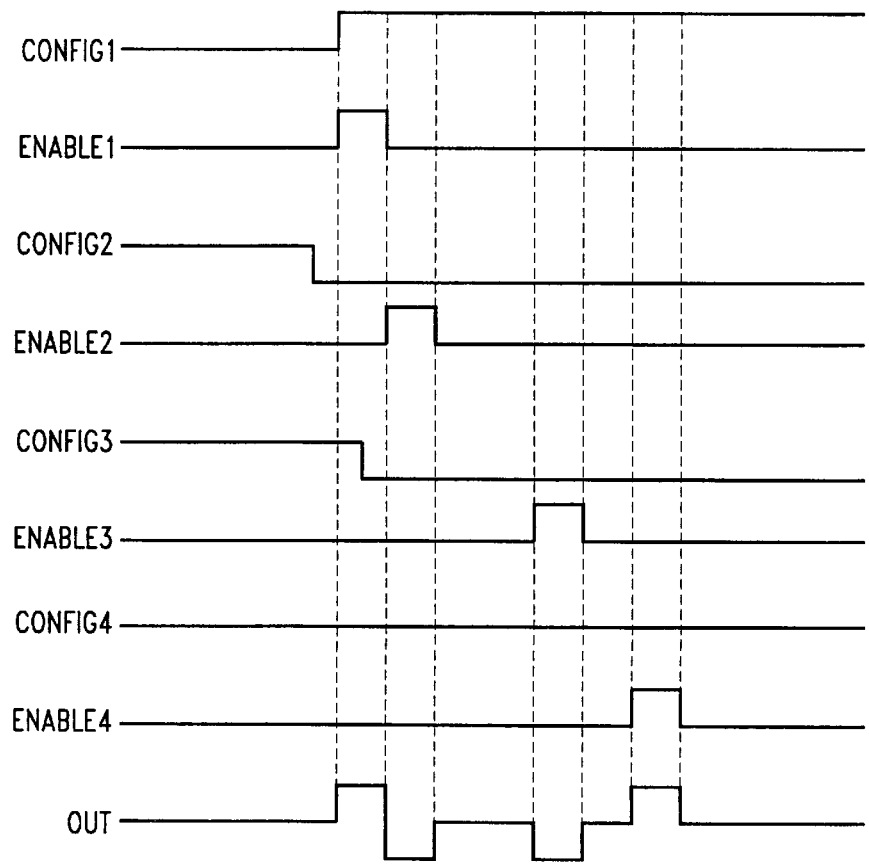
FIG. 12 is a timing diagram of signals shown in FIG. 11.

FIG. 12 is a timing diagram showing the signals of FIG. 11. For example purposes, n=4, Config1–Config4 are active low, and Enable1–Enable4 are active high. As shown, in one aspect of the invention, the control circuit 18 generates Enable1–Enable4 so as to sequentially enable the buffers 78 and to allow one to directly read the state of each of the signals Config1–Config 4 at the external pin 40. When the control circuit 18 generates Enable1–Enable4 equal to logic 0, OUT equals a tristate value. An advantage of the indicator 14 of FIG. 11 is that is uses only one pin 40 to provide both the number and identity of the enabled and disabled configurations.

FIG. 13 is a block diagram of a computer system 82 that uses the memory device 10 of FIG. 1. The computer system 82 includes computer circuitry 84 for performing computer functions, such as executing software to perform desired calculations and tasks. The circuitry 84 typically includes a processor 85 that is coupled to the memory device 10. One or more input devices 86, such as a keypad or a mouse, are coupled to the computer circuitry 84 and allow an operator (not shown) to manually input data thereto. One or more output devices 88 are coupled to the computer circuitry 84 to provide to the operator data generated by the computer circuitry 84. Examples of such output devices 88 include a printer and a video display unit. One or more data-storage devices 90 are coupled to the computer circuitry 84 to store data on or retrieve data from external storage media (not shown). Examples of the storage devices 90 and the corresponding storage media include drives that accept hard and floppy disks, tape cassettes, and compact disk read-only memories (CD-ROMs). Typically, the computer circuitry 84 includes address, data, control, and configuration buses that are coupled to the address, data, control, and configuration pins of the memory device 10.

From the foregoing it will be appreciated that, although specific embodiments of the invention have been described herein for purposes of illustration, various modifications may be made without deviating from the spirit and scope of the invention. For example, although various signals such as Config1–Confign are described as active low, these signals may be active high. Also, the switchable loads 54 (FIG. 6) may be formed from conventional bipolar transistors. Accordingly, the invention is not limited except as by the appended claims.

We claim:

1. A configurable integrated circuit, comprising:

a first externally accessible terminal through which a configuration input signal can be applied to the integrated circuit;

a second externally accessible terminal through which said integrated circuit can output an indicate signal;

a configuration circuit having an input terminal coupled to said first externally accessible terminal and having an output terminal, said configuration circuit operable to receive said configuration input signal that identifies a configuration, and to generate a configuration output signal that enables said configuration; and a configuration indicator having an input terminal coupled to said output terminal of said configuration circuit and having an output terminal coupled to said second externally accessible terminal, said configuration indicator operable to receive said configuration output signal and to generate on said second externally accessible terminal said indicate signal that identifies said enabled configuration.

2. The integrated circuit of claim 1, further comprising:

a control input pin;

a control circuit having an input terminal coupled to said control input pin and having an output terminal;

a function circuit having a control terminal coupled to said output terminal of said control circuit and having an output terminal; and a multiplexer interposed between said configuration indicator and said second externally accessible terminal, said multiplexer having a control terminal coupled to said output terminal of said control circuit, a first input terminal coupled to said output terminal of said configuration indicator, a second input terminal coupled to said output terminal of said function circuit, and an output terminal coupled to said second externally accessible terminal.

3. The integrated circuit of claim 1 wherein:

said configuration circuit includes a plurality of output terminals and generates thereon a plurality of configuration output signals that each have an active and an inactive logic level; and said configuration indicator includes,
first and second supply terminals,
a load having an impedance and coupled between said first supply terminal and said second externally accessible terminal,
a plurality of switchable loads that each have a different active-state impedance, a control terminal coupled to a corresponding one of said output terminals of said configuration circuit, and a switchable path coupled between said second externally accessible terminal and said second supply terminal.

4. The integrated circuit of claim 1, further comprising:

a control circuit having a plurality of output terminals and operable to generate thereon a plurality of enable signals;

said configuration circuit including a plurality of output terminals and generating thereon a plurality of configuration output signals that each have an active and an inactive logic level; and said configuration indicator including a plurality of switches that each have a control terminal coupled to a corresponding one of said output terminals of said control circuit, and a switchable path coupled between a corresponding one of said output terminals of said configuration circuit and said second externally accessible terminal.

5. The integrated circuit of claim 1, further comprising switching circuitry that is coupled to said configuration circuit and that is operable to configure the integrated circuit in said enabled configuration.

6. The integrated circuit of claim 1 wherein said configuration indicator comprises:

a driver circuit that is coupled to said second externally accessible terminal; and a logic circuit that is coupled to said output terminals of said configuration circuit and to said driver circuit, said logic circuit operable to cause said driver circuit to generate a first signal level if one and only one of said configurations is implemented, a second signal level if all of said configurations are implemented, and no signal level if none, or if more than one but not all, of said configurations are implemented.

7. The integrated circuit of claim 1 wherein said configuration indicator comprises:

a driver circuit that is coupled to said second externally accessible terminal; and a logic circuit that is coupled to said output terminals of said configuration circuit and to said driver circuit, said logic circuit operable to cause said driver circuit to generate a first signal level if at least one but not all of said configurations is implemented, a second signal level if all of said configurations are implemented, and no signal level if none of said configurations are implemented.

8. The integrated circuit of claim 1 wherein said configuration indicator comprises:

first and second supply terminals;

a load having an impedance and coupled between said first supply terminal and said second externally accessible terminal;

a plurality of switchable loads that each have a different active-state impedance, a control terminal, and a switchable path coupled between said second externally accessible terminal and said second supply terminal, each of said switchable loads corresponding to a different number between zero and the total number of said configurations; and a logic circuit coupled to said output terminals of said configuration circuit and having a plurality of output terminals that are each coupled to said control terminal of a corresponding one of said switchable loads, said logic circuit operable to activate the one of said switchable loads corresponding to the number of implemented configurations.

9. The integrated circuit of claim 1, further comprising a switching and multiplexing circuitry that is coupled to said configuration circuit and that is operable to configure the integrated circuit in those of said configurations that correspond to those of said configuration output signals having active levels.

10. A memory device, comprising:

a first externally accessible terminal through which a configuration input signal can be applied to the integrated circuit;

a second externally accessible terminal through which said integrated circuit can output an indicate signal;

a plurality of address pins;

one or more control pins;

a plurality of data pins;

an address decoder coupled to said address pins;

a control circuit coupled to said control pins;

an array of memory cells coupled to said address decoder and said control circuit;

a read/write circuit coupled to said array, said control circuit, and said data pins;

a configuration circuit having an input terminal coupled to said first externally accessible terminal and having an output terminal, said configuration circuit operable to receive said configuration input signal that identifies a configuration, and to generate a configuration output signal that enables said configuration; and a configuration decoder having an input terminal coupled to said output terminal of said configuration circuit and having an output terminal coupled to said second externally accessible terminal, said configuration indicator operable to receive said configuration output signal and to generate on said second externally accessible terminal said indicate signal that identifies said enabled configuration.

11. The memory device of claim 10, further comprising:

a function circuit coupled to said control circuit; and a multiplexer interposed between said configuration decoder and said second externally accessible terminal, said multiplexer having a control terminal coupled to said control circuit, a first input terminal coupled to said output terminal of said configuration decoder, a second input terminal coupled to said function circuit, and an output terminal coupled to said second externally accessible terminal.

12. The memory device of claim 10 wherein:

said configuration circuit includes a plurality of output terminals and generates thereon a plurality of configuration output signals that each have an active and an inactive logic level; and said configuration decoder includes,
first and second supply terminals,
a load having an impedance and coupled between said first supply terminal and said second externally accessible terminal,
a plurality of switchable loads that each have a different active-state impedance, a control terminal coupled to a corresponding one of said output terminals of said configuration circuit, and a switchable path coupled between said second externally accessible terminal and said second supply terminal.

13. The memory device of claim 10 wherein:

said control circuit includes a plurality of output terminals and is operable to generate thereon a plurality of enable signals;

said configuration circuit includes a plurality of output terminals and is operable to generate thereon a plurality of configuration output signals that each have an active and an inactive logic level; and said configuration decoder includes a plurality of switches that each have a control terminal coupled to a corresponding one of said output terminals of said control circuit, and have a switchable path coupled between a corresponding one of said output terminals of said configuration circuit and said second externally accessible terminal.

14. A method for configuring an integrated circuit, comprising:

receiving a configuration input signal that represents a configuration;

generating a configuration output signal in response to said configuration input signal;

enabling said configuration in said integrated circuit in response to said configuration output signal;

generating a status signal that identifies said enabled configuration; and providing said status signal in response to said configuration output signal.

15. The method of claim 14, further comprising selectively coupling said status signal and another signal to a same pin of the integrated circuit.

16. The method of claim 14, further comprising:

generating, in response to said configuration input signal, a plurality of configuration output signals each corresponding to one of a plurality of configurations and each having an active and an inactive logic level; and generating said status signal having a different signal level for each combination of configuration output signals having said active logic level.

17. The method of claim 14, further comprising:

generating, in response to said configuration input signal, a plurality of configuration output signals each corresponding to one of a plurality of configurations and each having an active and an inactive logic level; and sequentially coupling each of said configuration output signals to a same pin of said integrated circuit.

18. A method for configuring an integrated circuit, comprising:

receiving one or more configuration input signals that represent a plurality of configurations;

generating a plurality of configuration output signals in response to said one or more configuration input signals;

enabling said configuration in said integrated circuit in response to said plurality of configuration output signals;

generating a status signal that indicates the number of said active configuration output signals; and providing said status signal in response to said plurality of configuration output signals.

19. The method of claim 18 wherein said generating comprises:

generating said status signal having a first signal level if one and only one of said configuration signals is active;

generating said status signal having a second signal level if all of said configuration signals are active; and generating no signal level if none, or if more than one but not all, of said configuration signals are active.

20. The method of claim 18 wherein said generating comprises:

generating said status signal having a first signal level if at least one but not all of said configuration signals are active;

generating said status signal having a second signal level if all of said configuration signals are active; and generating said status signal having no signal level if none of said configuration signals are active.

21. The method of claim 18 wherein said generating comprises generating said status signal having a different signal level for each number of active configuration signals.

22. A computer system, comprising:

a data input device;

a data output device;

a configuration input bus;

a configuration output bus;

an address bus;

a control bus;

a data bus; and computing circuitry coupled to said data input and output devices, said configuration input, configuration output, data, control, and address busses, and said prefetch and strobe lines, said computing circuitry including a memory device that includes, an address decoder coupled to said address bus, a control circuit coupled to said control bus, an array of memory cells coupled to said address decoder and said control circuit, a read/write circuit coupled to said array, said control circuit, and said data bus, a configuration circuit coupled to said configuration input bus, address decoder, control circuit, array, and read/write circuit, said configuration circuit having an output terminal, said configuration circuit operable to receive a configuration input signal that identifies a configuration, and to generate a configuration output signal that enables said configuration, and a configuration indicator coupled to said control circuit and to said output terminal of said configuration circuit, said configuration indicator having an output terminal coupled to said configuration output bus, said configuration indicator operable to receive said configuration output signal and to generate on said configuration output bus an indicate signal that identifies said enabled configuration.

23. The computer system of claim 22 wherein said memory device further comprises:

a function circuit coupled to said control circuit; and a multiplexer interposed between said configuration indicator and said configuration output bus, said multiplexer having a control terminal coupled to said control circuit, a first input terminal coupled to said output terminal of said configuration indicator, a second input terminal coupled to said function circuit, and an output terminal coupled to said configuration output bus.

24. The computer system of claim 22 wherein:

said configuration circuit includes a plurality of output terminals and generates thereon a plurality of configuration output signals that each have an active and an inactive logic level; and said configuration indicator includes,
first and second supply terminals,
a load having an impedance and coupled between said first supply terminal and said configuration output bus,
a plurality of switchable loads that each have a different active-state impedance, a control terminal coupled to a corresponding one of said output terminals of said configuration circuit, and a switchable path coupled between said configuration output bus and said second supply terminal.

25. The computer system of claim 22 wherein:

said control circuit includes a plurality of output terminals and is operable to generate thereon a plurality of enable signals;

said configuration circuit includes a plurality of output terminals and is operable to generate thereon a plurality of configuration output signals that each have an active and an inactive logic level; and said configuration indicator includes a plurality of switches that each have a control terminal coupled to a corresponding one of said output terminals of said control circuit, and have a switchable path coupled between a corresponding one of said output terminals of said configuration circuit and said configuration output bus.

* * * * *